United States Patent
Gossner et al.

(10) Patent No.: US 6,320,232 B1
(45) Date of Patent: Nov. 20, 2001

(54) INTEGRATED SEMICONDUCTOR CIRCUIT WITH PROTECTIVE STRUCTURE FOR PROTECTION AGAINST ELECTROSTATIC DISCHARGE

(75) Inventors: Harald Gossner, München (DE); Matthias Stecher, Villach (AT)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/164,121

(22) Filed: Sep. 30, 1998

(30) Foreign Application Priority Data

Sep. 30, 1997 (DE) .............................. 197 43 230

(51) Int. Cl.[7] .................................. H01L 23/62
(52) U.S. Cl. .................. 257/360; 257/302; 257/355; 257/358; 257/360
(58) Field of Search ................... 257/302, 355, 257/358, 360

(56) References Cited

U.S. PATENT DOCUMENTS

| | | | |
|---|---|---|---|
| 5,821,797 | * 10/1998 | Kinugasa et al. | 327/318 |
| 5,835,986 | * 11/1998 | Wei et al. | 257/360 |
| 5,880,501 | * 3/1999 | Nagai | 257/355 |
| 5,883,414 | * 3/1999 | Ito | 257/355 |
| 5,920,096 | * 7/1999 | Lee | 257/355 |
| 5,932,914 | * 8/1999 | Horiguchi | 257/355 |
| 5,955,763 | * 9/1999 | Lin | 257/355 |
| 6,002,155 | * 3/1999 | Tahara et al. | 257/355 |

FOREIGN PATENT DOCUMENTS

| | | |
|---|---|---|
| 0 414 934 A1 | 3/1991 | (EP) . |
| 0 492 032 A1 | 7/1992 | (EP) . |
| 0 623 958 A1 | 11/1994 | (EP) . |
| 0 768 713 A2 | 4/1997 | (EP) . |
| 405102406 | * 4/1993 | (JP) ................ 257/355 |
| 405021714 | * 12/1993 | (JP) ................ 257/355 |
| 405326937 | * 12/1993 | (JP) ................ 257/355 |

OTHER PUBLICATIONS

International Application WO 95/17011 (Beigel et al.), dated Jun. 22, 1995.
Julian Z. Chen et al.: "Design and Layout of a High ESD Performance NPN Structure for Submicron BiCMOS/Bipolar Circuits", Proc. Of the IEEE International Reliability Physics Symposium, 1996, pp. 227–232.

* cited by examiner

Primary Examiner—Eddie Lee
Assistant Examiner—Edgardo Ortiz
(74) Attorney, Agent, or Firm—Herbert L. Lerner; Laurence A. Greenberg; Werner H. Stemer

(57) ABSTRACT

An integrated semiconductor circuit has a protective structure for protection against electrostatic discharge. The protective element has at least one integrated vertical protective transistor whose load path is connected between the terminal pad of the device and a busbar. The base and the collector of the protective transistor are laterally offset with respect to one another. In particular, the distance between the base and the collector is increased by lateral structuring of the collector of the protective transistor, which collector is constructed as a buried layer. In this way, it is possible to increase the breakdown voltage $U_{CB}$ and thus also the withstand voltage of the protective elements. The invention is particularly advantageous if the protective transistor is driven by a diode whose breakdown lies in the range of the withstand voltage of the protective transistor. The drive sensitivity of the base can be established, moreover, by an integrated resistor formed in the base zone.

11 Claims, 2 Drawing Sheets

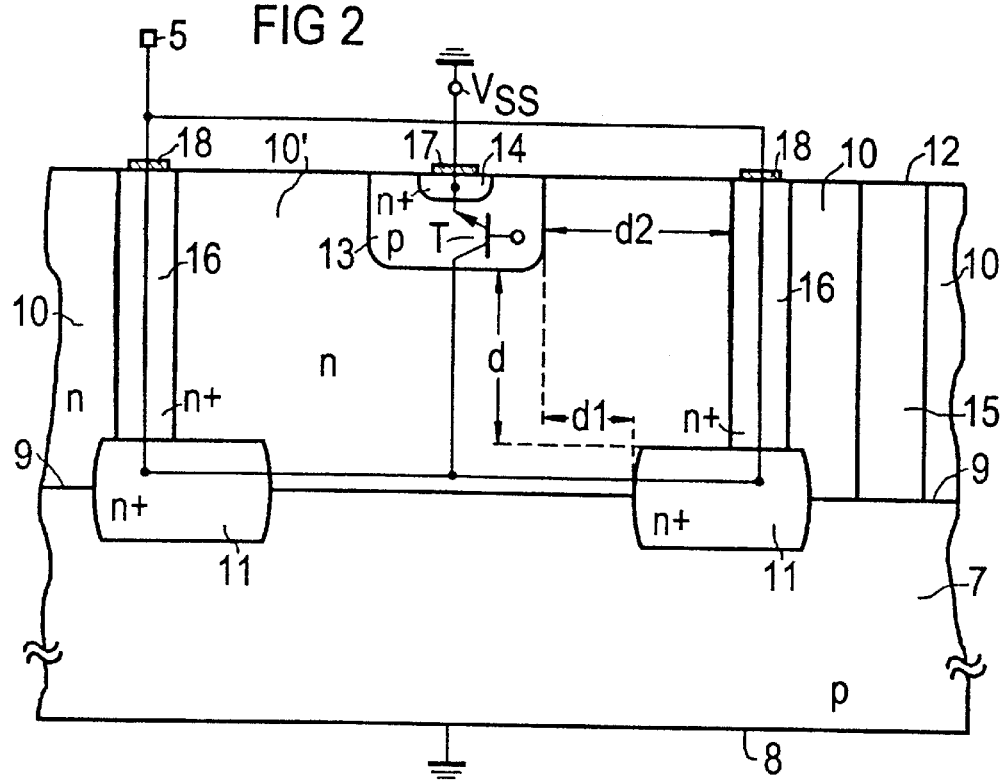
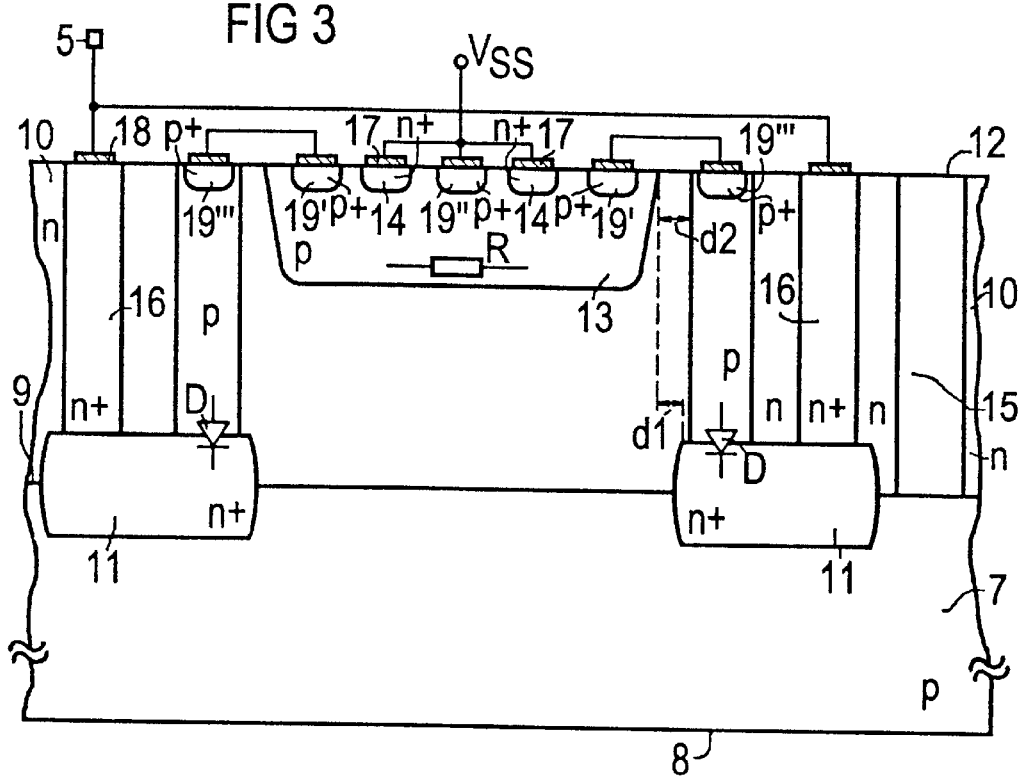

INTEGRATED SEMICONDUCTOR CIRCUIT WITH PROTECTIVE STRUCTURE FOR PROTECTION AGAINST ELECTROSTATIC DISCHARGE

BACKGROUND OF THE INVENTION

FIELD OF THE INVENTION

The invention relates to an integrated semiconductor circuit disposed in at least one semiconductor body and having the following features:

a) at least one terminal pad, which is connected via an electrically conductive connecting line to the integrated semiconductor circuit;

b) at least one first busbar, which carries a first supply potential of the integrated semiconductor circuit during operation;

c) at least one second busbar, which carries a second supply potential of the integrated semiconductor circuit during operation;

d) at least one protective element for protecting the integrated semiconductor circuit against electrostatic discharge, the protective element being arranged between the terminal pad and the integrated semiconductor circuit and being connected to at least one of the busbars;

e) the protective element having at least one integrated vertical protective transistor, having at least one base zone, at least one emitter zone and at least one collector zone, whose load path is connected between the connecting line and one of the busbars and whose base terminal can be driven by a driving means.

A so-called ESD protective element of this type is disclosed in J. Chen, X. Zhang, A. Amerasekera and T. Vrostos; Design and Layout of a High ESD Performance NPN Structure for Submicron BiCMOS/Bipolar Circuits, Proc. of the IEEE International Reliability Physics Symposium (1996), p. 227.

Semiconductor circuits integrated in a chip contain protective circuits for protecting the inputs or outputs (I/O ports) against electrostatic overvoltages and electrostatic discharges (ESD) caused thereby. These so-called ESD protective elements are connected between the input pad of an integrated semiconductor circuit and the input or output terminal to be protected, and consequently ensure that when a parasitic overvoltage is coupled in, the ESD protective element is turned on and the parasitic overvoltage pulse is consequently conducted away to one of the supply voltage conductor tracks. Such overvoltage pulses can lead, in the extreme case, to the destruction of the component.

Under operating conditions as are described for example in the product specification, however, the ESD protective elements must not adversely affect the function of the integrated semiconductor circuits to be protected. This means that the turn-on voltage of the ESD protective elements must lie outside the signal voltage range of the protected terminal pads. In order to be able to develop a good protective action, the ESD protective element should break down before the critical circuit path. As a rule, this requires an exact setting of the turn-on voltage of the respective ESD protective elements with the essential boundary condition that the process control, which has been optimized with regard to the properties of the components of the integrated semiconductor circuit to be protected, is not altered by the insertion of the ESD protective elements.

A further essential boundary condition results from the spatial arrangement of the terminal pads in immediate proximity to the integrated semiconductor circuit to be protected. In particular, the terminal pads are arranged in the vicinity of the output drivers owing to the relatively high current to be driven. The ESD protective structure is therefore frequently connected to that supply line from which the output driver is supplied.

For terminals that may be exposed to very fast voltage edges without the external circuitry ensuring sufficient current limiting, particular care must be taken, given the use of ESD protective elements which have a so-called snap-back behavior in the event of breakdown, to ensure that the withstand voltage lies above the specified signal voltage in order thereby to avoid a transient turn-on (latch-up effect) of the ESD protective elements. This latch-up effect of the ESD protective elements frequently leads to their destruction and, consequently, also to the destruction of the integrated semiconductor circuit connected downstream.

For these reasons, protective transistors, in particular npn bipolar transistors, or thyristors having a withstand voltage in the signal voltage range cannot be used as ESD protective elements, despite the high ESD strength and the good protective action. This applies particularly to semiconductor circuits fabricated using smart power technology. One is restricted here to breakdown diodes or transistors having a low gain, which have a low ESD strength in comparison with the components described above.

The withstand voltage of npn bipolar transistors, in particular of actively driven npn bipolar transistors, is described by the relationship $$U_H = U_{CB} * \beta^{-\frac{1}{4}}$$

where $\beta$ is the collector-base current gain and $U_{CB}$ is the collector-base breakdown voltage.

In order to increase the withstand voltage of the bipolar transistors, according to the equation above it is necessary either to increase the collector-base breakdown voltage or to reduce the current gain. However, a reduction of the current gain is not advantageous since the protective action would also be impaired as a result.

Consequently, it is necessary to increase the collector-base breakdown voltage in order to increase the withstand voltage of the protective element. At the same time, however, the breakdown voltages of the remaining components of the integrated semiconductor circuit must not be altered. From the boundary conditions described above, then, an enlargement of the epitaxial layer thickness and/or a reduction of the doping in the epitaxial layer are ruled out.

With regard to further details, features, their advantages and method of operation of the ESD protective circuits, reference is expressly made to European Patent Application EP 0 623 958 A1 and also to the document by J. Chen et al. mentioned in the introduction. These are incorporated by reference in their entirety.

SUMMARY OF THE INVENTION

It is accordingly an object of the invention to provide an integrated semiconductor circuit with protective structure for protection against electrostatic discharge (ESD protective structure), which overcomes the above-mentioned disadvantages of the heretofore-known devices and methods of this general type and the withstand voltage of which is increased without impairing the ESD strength and the protective action and under the predetermined boundary conditions.

With the foregoing and other objects in view there is provided, in accordance with the invention, an integrated semiconductor device, comprising:

a semiconductor body and an integrated semiconductor circuit disposed in the semiconductor body;

a terminal pad and a connecting line electrically connecting the terminal pad to the integrated semiconductor circuit;

a first busbar carrying a first supply potential during an operation of the integrated semiconductor circuit;

a second busbar carrying a second supply potential during an operation of the integrated semiconductor circuit; and a protective element for protecting the integrated semiconductor circuit against electrostatic discharge connected between the terminal pad and the integrated semiconductor circuit and to at least one of the first and second busbars;

the protective element including at least one integrated vertical protective transistor having a load path connected between the connecting line and one of the first and second busbars and having a base and a collector disposed laterally offset with respect to one another.

In other words, the objects of the invention are satisfied with an ESD protective element which is defined by a base zone and a collector zone which are arranged laterally offset with respect to one another.

In particular, the distance between base and collector is increased by lateral structuring of the collector of the protective transistor, which collector is constructed as a buried layer. In this way, the depletion zone of the transistor is enlarged in the epitaxial layer and the electric fields are reduced at the same potential differences. Consequently, the breakdown voltage $U_{CB}$ rises.

In accordance with an added feature of the invention, the collector of the protective transistor is formed in the semiconductor body as at least one buried layer of a first conductivity type; at least one base zone of a second conductivity type introduced into a partial region of an epitaxial layer of the first conductivity type and spaced apart from the buried layer forming the base of the protective transistor; and at least one emitter zone of the first conductivity type introduced in the base zone and acting as an emitter of the transistor.

In accordance with an additional feature of the invention, a driver drives the base of the protective element. Preferably, the driver includes at least one reverse-biased integrated diode. In particular when the base is connected up to a diode whose breakdown lies in the region of the withstand voltage of the protective transistor it is consequently possible to develop a virtually ideal ESD protective element which has adjustable voltage limiting right into the ampere range between the signal voltage upper limit and the breakdown voltage of critical voltage paths.

In accordance with another feature of the invention, the driver includes at least one integrated resistor. A conductance of the integrated resistor is defined by a doping concentration in a base zone forming the base of the protective transistor.

The integrated resistor is provided between the emitter and base terminals of the protective transistor. The integrated resistor makes it possible to establish the drive sensitivity of the base of the protective transistor. Typically, the integrated resistor is defined by the conductance of the base zone given suitable wiring up of the emitter and base terminals.

In accordance with a further feature of the invention, at least one connection zone is connected to the buried layer and to one of the first and second busbars, the at least one connection zone being spaced equidistantly from the base zones by a second distance.

In accordance with a specific feature of the invention, the connection zone is a closed ring around the partial region in the epitaxial layer.

The buried layer, in this configuration, is connected to the terminal pad via a connection zone, which is doped as heavily as possible for reasons of good conductivity. In this case, the connection zone defines a partial region in which the protective transistor is arranged. The partial region is typically arranged in an epitaxial layer. It is particularly advantageous if the connection zone is arranged as a closed ring around the partial region.

In this case, the connection zones are spaced equidistantly from the base zones by a second distance. The second distance may typically be chosen to be sufficiently large that the parasitic bipolar transistor in the edge region of the partial zone does not turn on. In smart power technology, the second distance may typically be set to be greater than 20 $\mu$m. It is about 2–3 $\mu$m given radio-frequency application.

In accordance with again another feature of the invention, a doping concentration in the buried layer is greater than $1*10^{19}$ cm$^{-3}$.

In accordance with again a further feature of the invention, a doping concentration in the connection zone is greater than $1*10^{19}$ cm$^{-3}$.

Typically, the emitter zone has a very much higher doping concentration than the base zones and/or the epitaxial layer. The doping concentration in the epitaxial layer is often defined by the process control for fabricating the integrated circuit.

The buried layer and the connection zones are very heavily doped in order to satisfy the requirements of a very high conductance. Typically, these zones have a doping concentration of more than $1*10^{19}$ cm$^{-3}$.

In accordance with a concomitant feature of the invention, an anode zone is formed between the buried layer and the terminal pad. In this case, the ESD protective element is constructed as an IGBT or as a thyristor.

The invention is particularly advantageous if it is used in a semiconductor memory or a logic component. A further advantageous application of the invention consists in the use in a microcontroller.

The invention is typically integrated in bipolar circuits. It is particularly advantageous, however, if the integrated semiconductor circuit and also the ESD protective element are fabricated using CMOS technology.

Other features which are considered as characteristic for the invention are set forth in the appended claims.

Although the invention is illustrated and described herein as embodied in an integrated semiconductor circuit with protective structure for protection against electrostatic discharge, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a diagrammatic elevational view of an implementation of a novel ESD protective structure in a semiconductor system;

FIG. 3 is a diagrammatic elevational view of an implementation of a preferred configuration of the inventive ESD protective structure in a semiconductor system according to FIG. 1.

DESCRIPTION OF THE PREFERRED EMBODIMENTS

Figure 1:
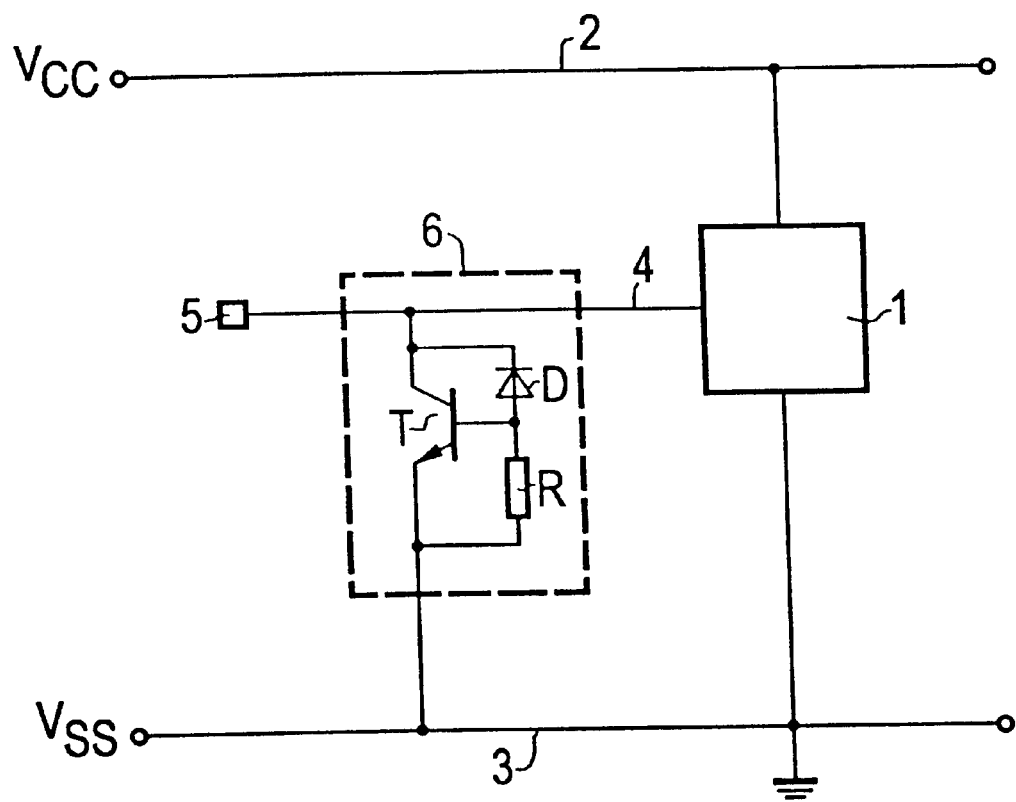
FIG. 1 is a schematic circuit diagram of a prior art integrated semiconductor circuit with an ESD protective element connected upstream.

Referring now to the figures of the drawing in detail and first, particularly, to FIG. 1 thereof, there is seen a circuit of a known integrated semiconductor circuit with an ESD protective element connected upstream.

The integrated semiconductor circuit 1 is connected to a first busbar 2 (first potential rail 2) having a first supply potential VCC and also to a second busbar 3 (second potential rail 3) having a second supply potential VSS. The first supply potential VCC may be the supply voltage, for example. The second supply potential VSS may, as in the present example, be reference ground.

The integrated semiconductor circuit 1 is connected to a terminal pad 5 by a connecting line 4. The terminal pad 5 may be either an input terminal for coupling input signals into the integrated semiconductor circuit 1 or an output terminal for coupling output signals out of the integrated semiconductor circuit 1. Terminals of this type are also referred to as I/O ports.

An ESD protective element 6 is connected between the terminal pad 5 and the integrated semiconductor circuit 1. In addition, the ESD protective element 6 is connected to the second busbar 3.

In the present example, the ESD protective element 6 comprises an npn protective transistor T, whose load path is connected between the connecting line 4 and the busbar 3. It would also be conceivable to use a pnp transistor as the protective transistor T. However, this depends on the underlying technology for fabricating the integrated semiconductor circuit 1. It would also be conceivable, of course, to realize the protective transistor T alternatively as a MOSFET, as a junction FET, as a thyristor, as an IGBT or as a customary controllable component which is suitably wired up.

A diode D is provided between the base-collector junction of the protective transistor T. A resistor R is provided between the base-emitter junction of the protective transistor T. In the present example, the base terminal of the protective transistor T is actively driven by the reverse-biased diode D. The driving voltage of the protective transistor T can be set by way of suitable dimensioning of the resistor R. However, it is also conceivable for the protective transistor T not to be driven actively. In this case, it is possible to dispense with the diode D.

In the present example, the ESD protective element 6 is connected between the connecting line 4 and the second busbar 3. It would, of course, also be conceivable for the ESD protective element 6 to be arranged between the connecting line 4 and the first busbar 2 and/or between the connecting line 4 and both busbars 2, 3.

The ESD protective element 6 is intended to protect the integrated semiconductor circuit 1 against parasitic interference signals coupled in via the terminal pad 5. These parasitic interference signals are conducted away via the ESD protective element 6 to one of the busbars 2, 3 and, consequently, do not pass into the integrated semiconductor circuit 1.

Interference signals of this type can arise, for example, during transportation and/or during handling of the semiconductor chip. The semiconductor chip can be electrostatically charged thereby. If the electrostatic charge is coupled into the integrated semiconductor circuit 1, this can lead, in the extreme case, to the destruction of the integrated semiconductor circuit 1.

In order to simulate the coupling in of an interference signal, the so-called human body model (HBM) is typically used. The equivalent circuit diagram of the human body model provides a low-pass filter, comprising a capacitance of 100 pF and a resistance of 1.5 kW. The human body model simulates an interference signal coupled in by a human. It is also conceivable to use other models such as, for example, the so-called charged device model (CDM).

FIG. 2 shows a diagrammatic illustration of the realization of an inventive ESD protective structure in a semiconductor system. Identical elements are provided with the same reference symbols in accordance with FIG. 1.

In FIG. 2, a semiconductor body is designated by 7. The semiconductor body 7 typically comprises a silicon substrate. The semiconductor body 7 has a wafer rear side 8 and a substrate surface 9. In the present example, the silicon substrate of the semiconductor body 7 is p-doped and, on the wafer rear side 8, is at the potential of the reference ground. Of course, it is also conceivable for the semiconductor substrate to be n-doped. A weakly n-doped epitaxial layer 10 is applied on the substrate surface 9 of the semiconductor body 7. For the function of the ESD protective structure, it would also be conceivable to arrange a plurality of epitaxial layers 10 one above the other or to dispense with the epitaxial layer 10 entirely. The doping concentration in the epitaxial layer 10 is defined by the process control for fabricating the integrated semiconductor circuit 1. Typically, the epitaxial layer has a doping concentration of $1*10^{15}$ $cm^{-3}$ to $1*10^{18}$ $cm^{-3}$. The thickness of the epitaxial layer 10 in this case varies between 1–10 $\mu$m, depending on the technology used.

In addition, as shown in FIG. 2, a buried layer 11 is provided. The buried layer 11 is $n^+$-doped in the present example. The buried layer 11 can be produced for example by introduction of a deposit on the substrate surface 9 prior to growth of the epitaxial layer 10 and subsequent diffusion at a suitable temperature.

However, it is also advantageous if the buried layer 11 is produced by ion implantation into the semiconductor body 7 after the growth or during the growth of the epitaxial layer 10. In order to obtain the desired vertical profile, multiple implantation at suitable energies and doping doses is frequently necessary in this case. This should be followed by a heat-treatment step or homogeneous distribution of the doping atoms in the buried layer 11.

The doping concentration in the buried layer 11 is often predetermined by the process control in the course of fabricating the integrated circuit 1. In order to ensure the best possible conductivity, the buried layer 11 should be constructed with the lowest possible resistance. On account of this, the buried layer 11 typically has a doping concentration of about $10^{19}$ $cm^{-3}$.

The buried layer 11 is connected via connection zones 16 to the wafer front side 12 of the semiconductor body 7. The connection zone 16 is of the same conductivity type as the buried layer 11 and has an extremely high doping concentration of $1*10^{20}$ $cm^{-3}$. In the present example, the connection zone 16 extends as a deep implantation or diffusion zone from the wafer surface 12 into the semiconductor body 7 and is connected to the buried layer 11. The connection zones 16 are in this case constructed as trenches and can be produced using known trench technology.

In the projected plan view (not illustrated), the connection zones 16 and the buried layer 11 described have a ring-shaped structure. However, the ring-shaped structure need not necessarily be closed. The ring-shaped structure of the connection zone 16 may be of circular, rectangular or polygonal construction. Alternatively, a strip-shaped structure would also be conceivable.

The buried layer 11, on the one hand, and the connection zones 16, on the other hand, encompass a so-called partial region 10' of the epitaxial layer 10.

A base zone 13 is arranged at the wafer surface 12 in the partial region 10'. In the present exemplary embodiment, the base zone 13 is p-doped and constructed in the form of a well. In addition, an emitter zone 14 in the form of a well and of the opposite conductivity type is arranged at the wafer surface 12 within the base zone 13.

The emitter zone 14 typically has a doping concentration of $5*10^{19}$ cm$^{-3}$. In this case, the emitter zone well projects about 1 $\mu$m into the semiconductor body 7. The base zone 13 has a typical doping concentration of $10^{16}$–$10^{17}$ cm$^{-3}$, its well having a depth of about 2.5 $\mu$m.

FIG. 2 diagrammatically illustrates the equivalent circuit diagram of the ESD protective structure in the cross section. In this case, the emitter zone 14, the base zone 13 and the buried layer 11 respectively form the emitter, the base and the collector of the protective transistor T. The protective transistor T in FIG. 2 is not actively driven. In this case, the protective element 6 is realized as a protective transistor T in a diode connection.

In the case of purely vertical ESD protective elements, the turn-on voltage of the protective transistor T typically results from the distance d between the base zone and the collector zone arranged directly underneath, or the buried layer 11. As a result of the so-called quasi-vertical ESD protective structure according to the invention, this distance d is enlarged by the collector zone being offset laterally relative to the base zone. As a result, the turn-on voltage of the relevant ESD protective elements is correspondingly increased.

Consequently, what is essential to the invention in the case of the present ESD structure is the fact that the base zone 13 in the form of a well and the ring structure of the buried layer 11 are arranged in such a way that the outer edge of the well of the base zone 13 is arranged laterally offset with respect to the inner edge of the buried layer 11. This lateral offset is characterized by a first distance d1.

The base zone 13 is arranged in the partial region 10' in such a way that it is spaced apart from the connection zone 16 by a second distance d2. In this case, the second distance d2 can be chosen to be large enough that the lateral parasitic pn diode in the edge region of the partial region 10' is suppressed. Typically, this distance is greater than 20 $\mu$m.

The base zone 13 and the emitter zone 14 are constructed in well form in the present example. However, V-shaped, U-shaped, trench or similar structures would also be conceivable. These zones 13, 14 are advantageously introduced by diffusion or ion implantation into the semiconductor body 7. However, an alternative fabrication possibility, such as, for example, a deposition or the like, would also be conceivable.

Connection is made with the base zone 13 and the connection zone 16 via customary contacts 17, 18 on the wafer surface 12. In this case, the first contact electrodes 17 of the emitter zones 14 are in each case connected to the second busbar 3 and thus to the reference ground. The second contact electrodes 18 of the connection zones 16 are connected to the terminal pad 5.

Additionally provided in FIG. 2 is a buffer zone 15, which extends from the wafer front side 12 through the entire epitaxial layer 10 down into the semiconductor body 7. In the present example, the buffer zone 15 is composed of silicon dioxide. However, the buffer zone 15 may also be formed by any other customary buffer material, for example heavily doped polysilicon, silicon nitride or the like. The buffer zone 15 usually has the function of shielding or isolating the ESD protective structures from the integrated semiconductor circuit 2 or the semiconductor chip.

It is particularly advantageous if the buffer zone 15 is composed of p$^+$-doped polysilicon. In this case, it is possible to utilize the forward-biased pn diode between buried layer 11 and p-doped substrate 7 in order to dissipate negative pulses, for example. These negative pulses can then be conducted away via the p$^+$-doped buffer zone 15.

Typically, the lateral cross-sectional area which is enclosed by the buried layer 11 is greater than the corresponding cross-sectional area enclosed by the connection zone 16.

The method of operation of the ESD protective structure according to the invention will be explained in more detail below.

If an interference signal is coupled in via the terminal pad 5 and if this interference signal exceeds the switching threshold of the protective transistor T, then the space charge zone at the pn-junction of the protective transistor T, which is connected in a diode connection, breaks down. The protective transistor T turns on. Consequently, a current path is produced from the terminal pad 5 via the connection zones 16, the buried layer 11, the base zone 13, to the emitter zone 14 and, consequently, to the second busbar 3. The interference signal is consequently conducted away onto the second busbar 3 and thus does not pass into the integrated semiconductor circuit 1.

It would also be advantageous if there were an anode zone arranged between the buried layer 11 and the terminal pad 5. In this case, the ESD protective element 6 is constructed as an IGBT or as a thyristor.

The turn-on voltage of the active protective element can additionally be set by a suitable choice of the base width of the protective transistor.

The invention is particularly advantageous in the case of the use of the ESD protective element 6 in a microcontroller, in a semiconductor memory or in a logic component.

The integrated semiconductor circuit and also the associated ESD protective element are preferably realized in bipolar form or using smart power technology. However, it is particularly advantageous if the integrated semiconductor circuit 1 and also the ESD protective circuit are fabricated using CMOS technology.

FIG. 3 shows a diagrammatic illustration of the realization of a preferred inventive ESD protective structure in a semiconductor system. Identical elements are provided with the same reference symbols in accordance with FIG. 1.

FIG. 3 shows a preferred development of the structure shown in FIG. 2. In this case, heavily doped contact regions 19', 19" of the same conductivity type are arranged in the well of the base zone 13. In addition, a multiplicity of emitter zones 14 are provided in the well of the base zone 13. Second connection regions 20 are additionally provided in the partial region 10'. In an equivalent manner to the connection regions 16, the second connection regions 20 extend from the wafer front side 12 into the semiconductor body 7 and are connected to the buried layer 11. In the present example, the second connection regions 20 are situated within the partial region 10' enclosed by the connection region 16. The second connection regions 20 are spaced apart from the connection regions 16 and have a very high doping concentration of the opposite conductivity type. In the present case, the second connection regions 20 have p$^+$-type doping with a doping concentration of, typically, $1*10^{20}$ cm$^{-3}$.

The second connection regions 20 have contact regions 19''' at the wafer surface 12. These contact regions 19''' are connected via connecting lines 21 to corresponding contact regions 19' in the base zone 13. The remaining contact regions 19'' in the base zone 13 are connected via connecting lines to the emitter zones 14 and, consequently, to the second supply potential of the second busbar 3.

The contact regions 19', 19'', 19''' have a typical doping concentration of $10^{20}$ cm$^{-3}$. The doping profile thereof projects about 0.5 µm to 1 µm into the semiconductor body 7.

The equivalent circuit diagram, shown in FIG. 1, of the ESD protective element 6 with a protective transistor T as well as a diode D and a resistor R for driving the base of the said transistor applies to the structure shown in FIG. 3. For the sake of clarity, this equivalent circuit diagram is not illustrated in FIG. 3. Only the position of the integrated resistor R and of the integrated diode D is indicated in FIG. 3.

With the wiring up given, the integrated resistor R results from the doping concentration in the base zone 13 between neighbouring contact regions 19', 19''. Furthermore, an integrated diode D is indicated in FIG. 3 in each case between the second connection regions 20 and the buried layer 11. The diodes D and the resistor R consequently drive the base of the protective transistor T.

The method of operation of the arrangement shown in FIG. 3 is explained in more detail below.

If an interference signal, for example a current pulse, is coupled in via the terminal pad 5 and if this current pulse exceeds the turn-on threshold of the diodes D, then the space charge zone at the pn junction of the diodes D breaks down and the base of the protective transistor T is driven. Given a sufficiently high base current, the protective transistor T turns on. Consequently, a current path is produced from the terminal pad 5 via the connection zone 16, the buried layer 11, via the partial zone 10' and the base zone 13 to the emitter zones 14 and, consequently, to the second busbar 3. Consequently, interfering pulses of this type do not pass into the integrated semiconductor circuit 1 but rather are conducted away via one of the busbars 2, 3.

In contrast to the ESD structure shown in FIG. 2, active base driving is effected in FIG. 3 via the integrated diodes D and also via the resistor R. The turn-on threshold of the diodes D can be set by way of the doping concentration in the second connection regions 20. Consequently, the drive sensitivity of the protective transistor T1 can be established by means of a suitable doping concentration in the second connection zones 20 and also by way of the doping concentration of the base zone 13.

We claim:

1. An integrated semiconductor device, comprising:
   a semiconductor body and an integrated semiconductor circuit disposed in said semiconductor body;
   a terminal pad and a connecting line electrically connecting said terminal pad to said integrated semiconductor circuit;
   a first busbar carrying a first supply potential during an operation of said integrated semiconductor circuit;
   a second busbar carrying a second supply potential during an operation of said integrated semiconductor circuit; and
   a protective element for protecting said integrated semiconductor circuit against electrostatic discharge connected between said terminal pad and said integrated semiconductor circuit and to at least one of said first and second busbars; and
   at least one base zone of a second conductivity type introduced into a partial region of an epitaxial layer of the first conductivity type, said at least one base zone having an outer edge;
   said protective element including at least one integrated vertical protective transistor having a load path connected between said connecting line and one of said first and second busbars and having a base and a collector;
   said collector of said protective transistor formed in said semiconductor body as at least one buried layer of a first conductivity type, said at least one buried layer having a ring-shaped structure with an inner edge;
   said outer edge of said at least one base zone being laterally offset with respect to said inner edge of said ring-shaped structure of said at least one buried layer of said collector.

2. The integrated semiconductor device according to claim 1, comprising:
   at least one emitter zone of the first conductivity type introduced in said base zone and acting as an emitter of said transistor.

3. The integrated semiconductor device according to claim 1, including a driver driving the base of said protective element.

4. The integrated semiconductor device according to claim 3, wherein said driver includes at least one reverse-biased integrated diode.

5. The integrated semiconductor device according to claim 3, wherein said driver includes at least one integrated resistor.

6. The integrated semiconductor device according to claim 5, wherein a conductance of said integrated resistor is defined by a doping concentration in a base zone forming said base of said protective transistor.

7. The integrated semiconductor device according to claim 2, which further comprises at least one connection zone connected to said buried layer and to one of said first and second busbars, said at least one connection zone being spaced equidistantly from said base zones by a second distance.

8. The integrated semiconductor device according to claim 7, wherein said connection zone is a closed ring around said partial region in the epitaxial layer.

9. The integrated semiconductor device according to claim 2, wherein a doping concentration in said buried layer is greater than $1*10^{19}$ cm$^{-3}$.

10. The integrated semiconductor device according to claim 7, wherein a doping concentration in said connection zone is greater than $1*10^{19}$ cm$^{-3}$.

11. The integrated semiconductor device according to claim 2, which further comprises an anode zone between said buried layer and said terminal pad.

* * * * *